United States Patent [19]

Horne

[11] 4,313,024
[45] Jan. 26, 1982

[54] CONVERSION OF SOLAR TO ELECTRICAL ENERGY

[76] Inventor: William E. Horne, 17266 NE. 18th Pl., Bellevue, Wash. 98005

[21] Appl. No.: 784,943

[22] Filed: Apr. 5, 1977

[51] Int. Cl.³ .......................................... H01L 31/04
[52] U.S. Cl. ...................................... 136/253; 136/246
[58] Field of Search ............ 136/89 PC, 89 HY, 246, 136/253

[56] References Cited

U.S. PATENT DOCUMENTS

| | | | |
|---|---|---|---|
| 755,840 | 3/1904 | Bose | 136/89 X |
| 1,697,451 | 1/1929 | Baird | 136/89 |
| 2,259,372 | 10/1941 | Geisler | 136/89 |
| 3,091,555 | 5/1963 | Smythe | 117/201 |
| 3,121,795 | 2/1964 | Marvin | 250/212 |
| 3,331,707 | 7/1967 | Werth | 136/89 |
| 3,431,439 | 3/1969 | Bensimon | 310/4 |
| 3,483,037 | 12/1969 | Wagle | 136/89 |
| 3,483,040 | 12/1969 | Parkins | 136/89 |
| 3,591,420 | 7/1971 | Streed | 136/89 |
| 3,751,303 | 8/1973 | Kittl | 136/89 |
| 3,929,510 | 12/1975 | Kittl | 136/206 |
| 3,988,166 | 10/1976 | Beam | 136/89 |

OTHER PUBLICATIONS

A. B. Meinel et al. "Applied Solar Energy", Addison-Wesley Publishing Co., Reading, Mass. (1976), pp. 316-320.

*Primary Examiner*—Aaron Weisstuch
*Attorney, Agent, or Firm*—Delbert J. Barnard

[57] ABSTRACT

Solar energy is collected by a concave mirror and directed onto a body located within a container which is lined with solar cells. The heated body radiates energy to the solar cells. The solar cells convert a portion of such radiated energy to electricity. Another portion is converted to heat which is removed by a heat exchanger. A third portion of the radiated energy which is not absorbed by the solar cells or their support structure is reflected back to the radiating body to help maintain its temperature.

3 Claims, 14 Drawing Figures

Fig.3.
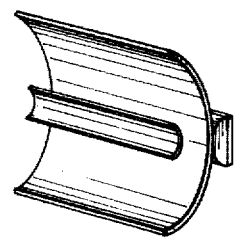
Fig.4.
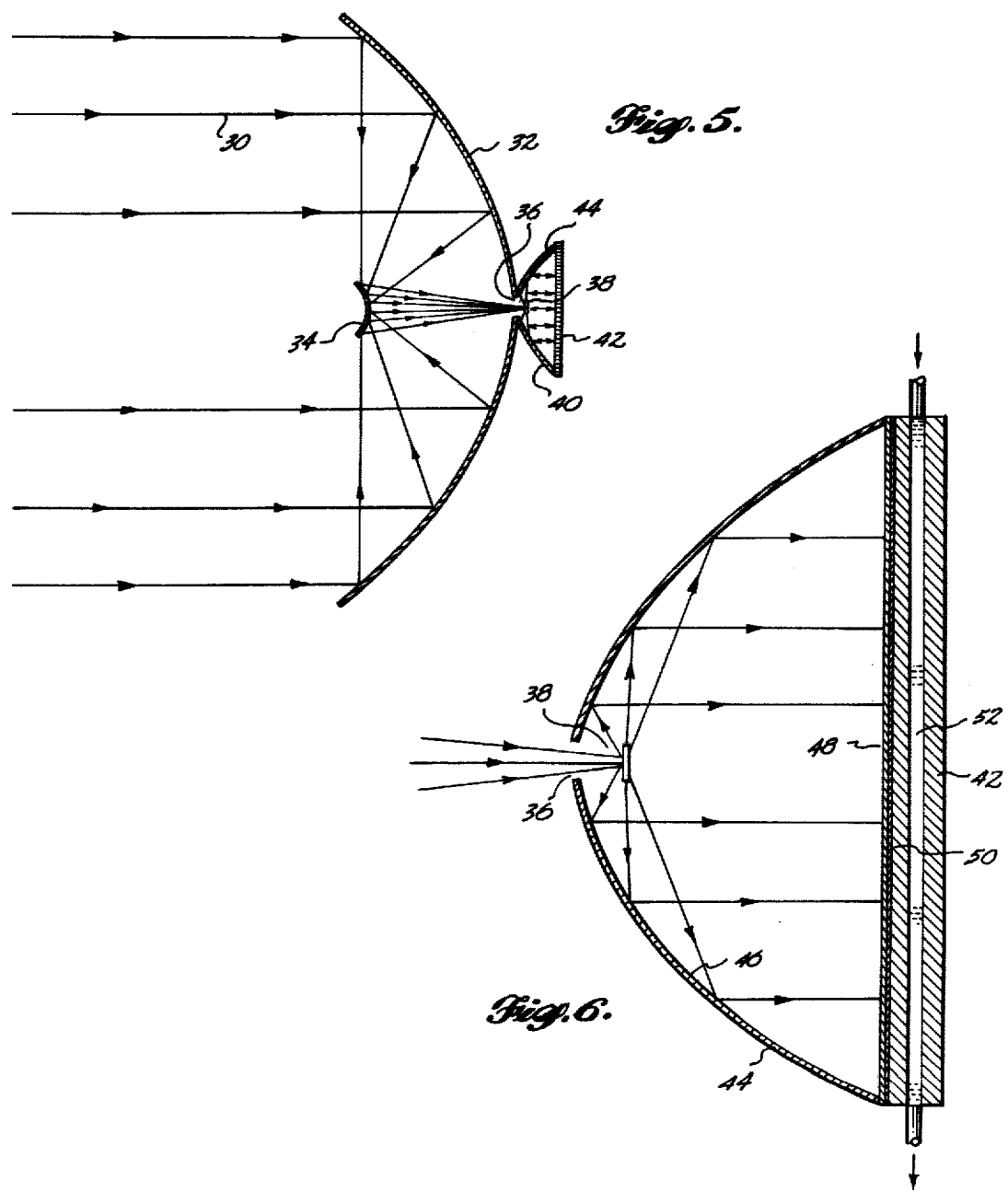
Fig.5.
Fig.6.

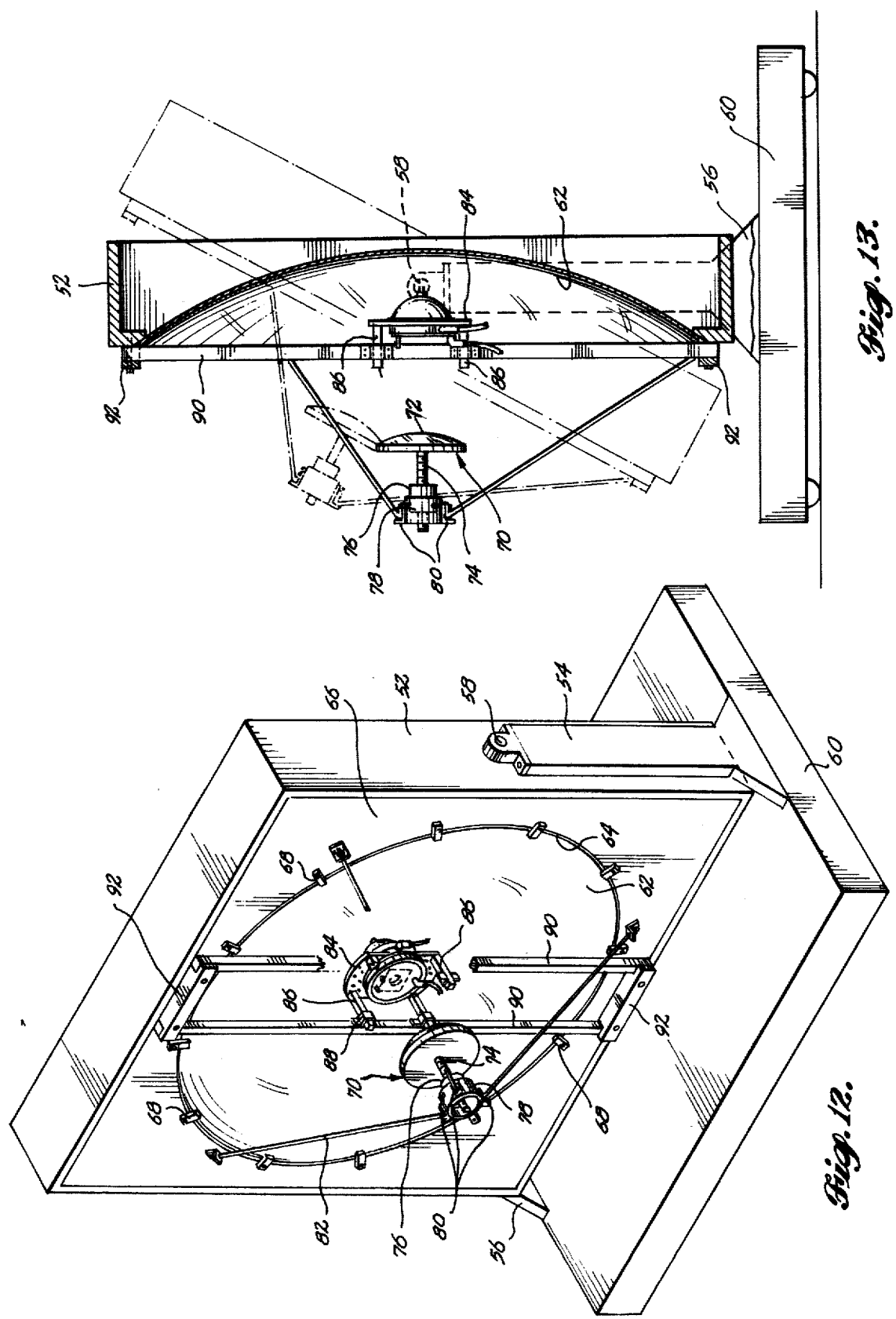

4,313,024

CONVERSION OF SOLAR TO ELECTRICAL ENERGY

BACKGROUND OF THE INVENTION

1. Field of the Invention

This invention relates to sun powered electrical generators, and more particularly to a method and apparatus for changing the spectral characteristics of the sun rays before directing them onto the solar cells, to make them more closely match the response function of the solar cells.

2. Description of the Prior Art

As is well known, a solar battery is a dc power source made up of several solar cells connected in series or parallel or both, to deliver useful amounts of power when illuminated by sunlight. Heavy duty photo-electric batteries are used in space satellites, control devices, emergency telephone power supplies, portable radios, and other places. Generally speaking a solar cell is a heavy duty photovoltaic cell; that is, a self-generating cell that can produce usefully high voltage and current when exposed to sunlight. One known type of solar cell is the silicon cell. This type of photovoltaic cell delivers the highest output for a given light intensity. In a typical silicon cell an n-silicon layer is applied to a metal back plate which becomes the negative output electrode. A thin p-type layer then is formed on, or diffused into, the exposed face of the n-type layer. Finally, for ohmic contact, a sprayed-on (or plated) strip is applied to the p-type layer to serve as the positive output electrode.

A typical solar battery comprises one or more planar panels of photovoltaic cells which in use are oriented to face towards the sun. Not all of the solar energy received by the solar battery is converted to electricity. Some of it merely heats the solar battery and other portions of it are either reflected back towards the sun or passes through the solar battery.

In accordance with the present invention, the solar spectrum is converted to a new spectrum which more closely matches the response function of the solar cells, so that less heat is generated and more electricity produced by the photon energy which reaches the solar cells. Also, according to an aspect of the invention, the long wave length photon energy which is allowed to pass through conventional solar batteries is collected and utilized for the purpose of further increasing the efficiency of the system.

The present invention involves the use of reflectors or mirrors for concentrating solar energy at the focus of the reflector. This practice is per se old and has been utilized in solar heating systems wherein an object to be heated (i.e. a fluid conduit) is located at the focus of a curved reflector. It is also known per se to reflect infrared photon energy back towards a source of radiant energy, as is disclosed in U.S. Pat. No. 3,331,707, granted July 18, 1967 to John J. Werth. However, it is not known to increase the efficiency of a solar battery system by changing the spectral characteristics of the photon energy received from the sun before directing it onto solar cells for generating useful electricity.

SUMMARY OF THE INVENTION

According to the present invention, one or more curved reflectors are used for collecting sun rays and concentrating them on a black body which is spaced from a group of photovoltaic cells which form a solar battery. The sun rays heat the black body to make it a radiating body. The spectrum of photon energy radiated from such body to the solar battery more closely matches the response function of the photovoltaic cells than do the direct sun rays. The spectral peak of the converted rays very closely match the electron production threshold of the photovoltaic cells. This results in a greater amount of the energy which is absorbed by the photovoltaic cells being converted to electrical energy and a smaller amount being converted to heat which must be carried away.

According to one aspect of the invention, the photon energy which initially passes through the photovoltaic cells is reflected back to the black body to help maintain its temperature and in that way can be utilized and help increase the efficiency of the system.

BRIEF DESCRIPTION OF THE DRAWING

FIG. 3 is a pictorial view of a second embodiment of the invention involving a circular geometry;

FIG. 4 is a view like FIG. 3, but of a third embodiment of the invention involving a cylindrical geometry;

FIG. 5 is a sectional view which could be taken through either one of the embodiments disclosed by FIGS. 3 and 4;

FIG. 6 is an enlarged scale sectional view of the housings for the black body and the photovoltaic cells in the embodiments of FIGS. 3-5;

FIG. 12 is a pictorial view of a test installation, taken from above and looking toward the front and one end of the installation, with portions of the support structure for the convex mirror removed, and with a portion of the support structure for a housing which contains the black body and the photovoltaic cells also removed;

FIG. 13 is a vertical section view taken through the test installation; and

DESCRIPTION OF THE PREFERRED EMBODIMENTS

Figure 1:
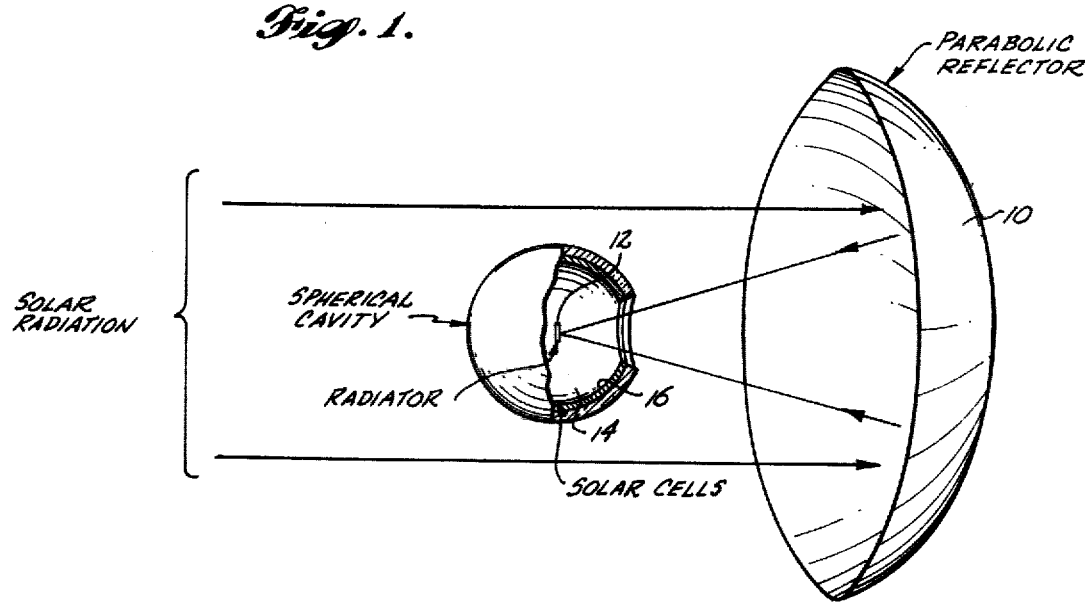
FIG. 1 is a pictorial view of a basic embodiment of the invention, with a foreground portion of the housing for the black body and the solar cells being cut away for clarity of illustration of the internal parts.
Figure 2:
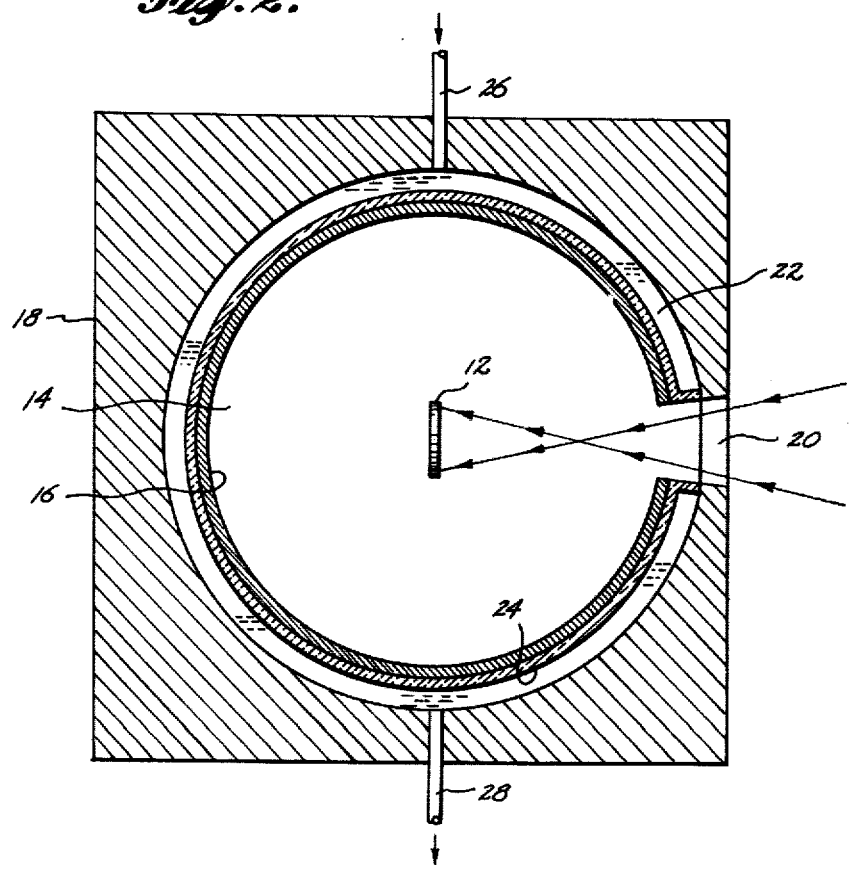
FIG. 2 is an enlarged scale sectional view taken axially through the housing of FIG. 1.

FIGS. 1 and 2 show a first embodiment of sun powered electrical generator incorporating the concepts of the present invention. It comprises a parabolic or similar concave reflector 10 which in use is positioned towards the sun to collect and concentrate the sun's rays onto a black body or radiator 12 within a spherical cavity 14 lined by photovoltaic (viz. solar) cells 16.

As shown by FIG. 2, the spherical cavity may be formed in a housing 18 which includes a window 20 for receiving the concentrated sun rays. A coolant jacket 22 immediately surround a reflector 24 which immediately surrounds the photovoltaic cells 16. A coolant fluid is introduced into space 22 via an inlet passageway 26 and is removed therefrom via an outlet passageway 28.

Another possible configuration is a Cassegrainian system which offers the possibility of using a back wall as a radiator for some of the heat that must be rejected. Two embodiments of a Cassegrainian system are illustrated by FIGS. 3–5. FIG. 5 is an axial sectional view of the circular embodiment shown by FIG. 3, but it could just as well be a transverse sectional view of the cylindrical configuration shown by FIG. 4.

Referring to FIG. 5, the parallel sun rays 30 are concentrated by a parabolic or similarly curved primary reflector 32 onto the face of a convex (e.g. hyperboloidal) secondary reflector 34 which is located generally at the focus of the reflector 32. Reflector 34 directs the sun rays through a window 36 formed at the apex of reflector 32 and concentrates them on a black body or radiator 38 which is mounted within a housing 40. Housing 40 includes a planar rear wall portion 42 and a parabolic or similarly shaped front wall 44. As shown by FIG. 6, the black body 38 is positioned generally at the focus of a concave mirror 46 formed on the inner surface of wall 44.

The concentrated sunlight which enters through the window 36 serves to heat the black body 38 to make it a radiating body. Some of the energy which radiates from it is radiated directly towards the photovoltaic cells 48 which are mounted on the inner side of wall 42. The photons which are radiated against the concave mirror surface 46 are reflected by such surface to the photovoltaic cells 48.

The photovoltaic cells 48 are mounted on a reflector 50 which serves to reflect the photon energy which is not absorbed by the photovoltaic cells 48 or wall 42 back to the black body 38, to help maintain its temperature, as will hereinafter be discussed in some detail.

Wall 42 is constructed to radiate some of its heat but it also includes a coolant jacket 52 through which a coolant is circulated for removing heat.

Figure 7:
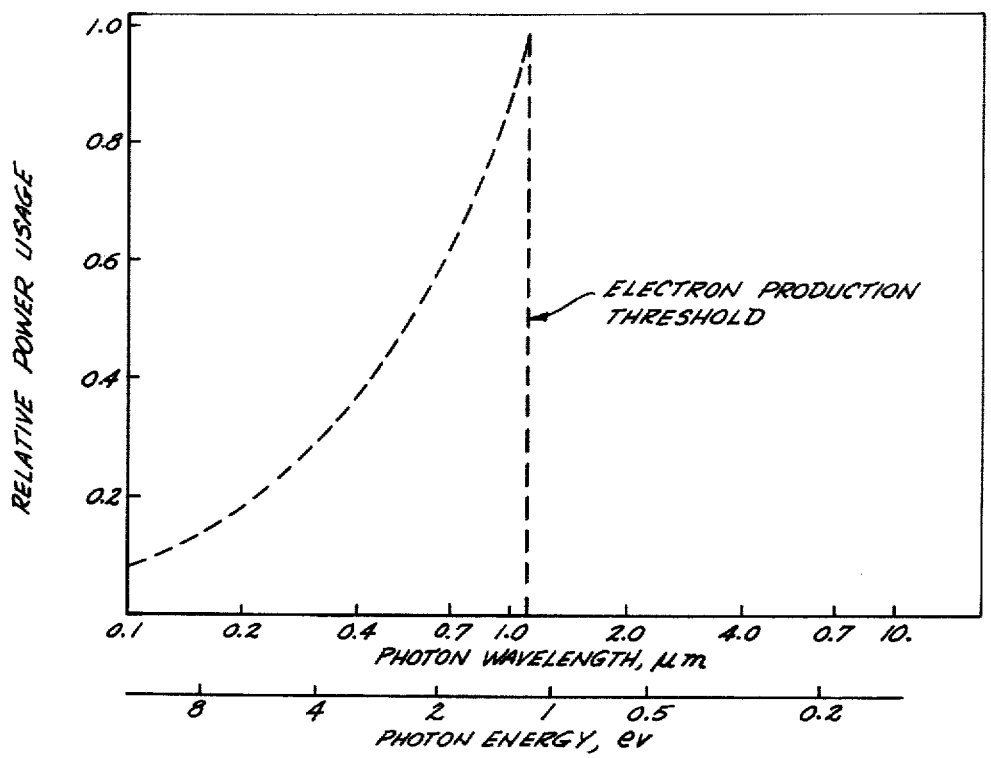
FIG. 7 is a graph of Photon Energy and Photon Wave Length versus Relative Power Usage, depicting the response function of the photovoltaic cells.
Figure 8:
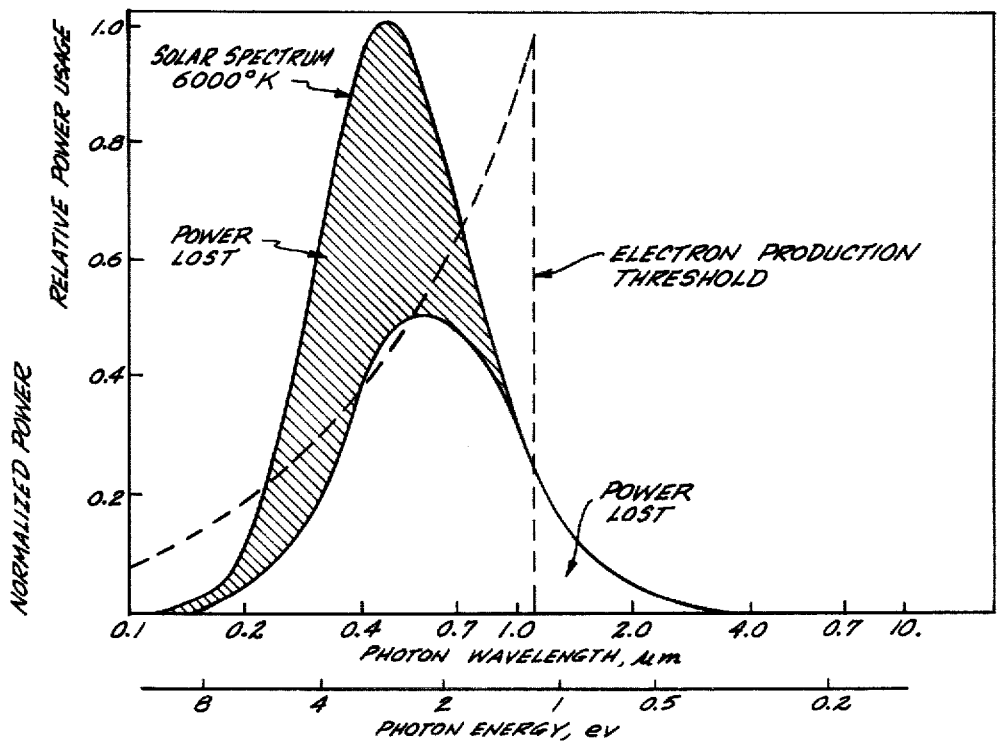
FIG. 8 is a graph like FIG. 7, but also including a plot of the Total Energy Absorbed by the photovoltaic cells when directly subjected to the sun's rays, divided into power lost by heat production, power utilized for generating electricity, and power lost by transmission.
Figure 9:
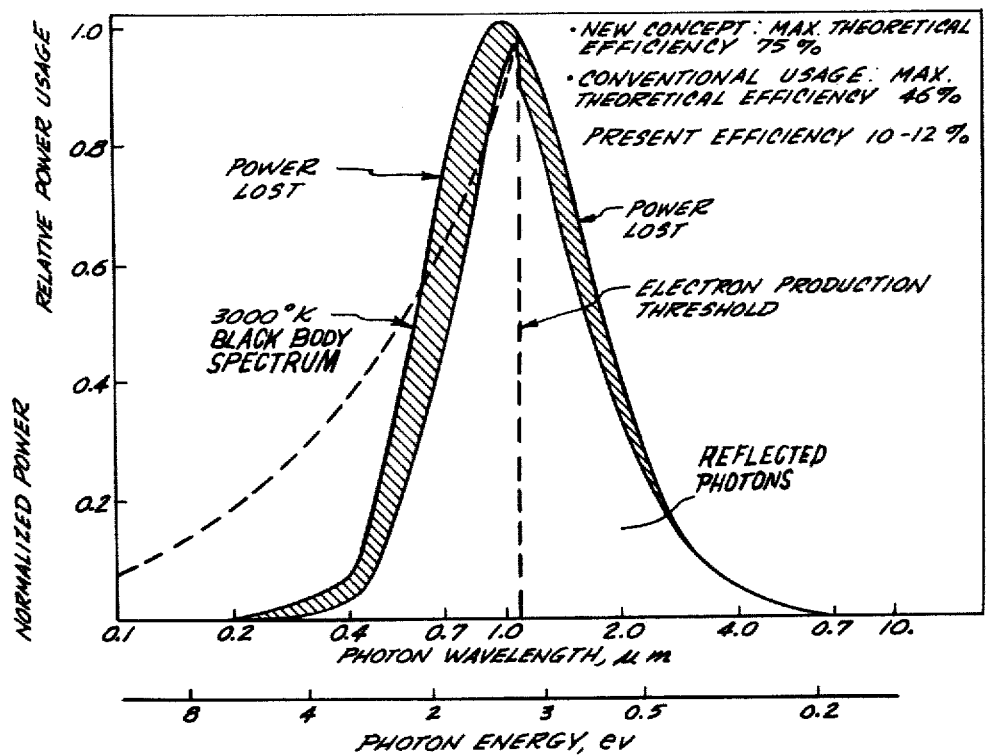
FIG. 9 is a graph similar to FIG. 8, but showing what happens when the reflectors and black body are used for changing the spectral characteristics of the photon energy from the sun before it is delivered to the photovoltaic cells.

To understand how the present invention increases the conversion efficiency of solar cells, one needs to recognize that a photon above the electron hole pair production threshold does not use all its energy in the production of an electron hole pair. For example, a 0.2 $\mu$m photon only requires 20% of its energy for the production of electricity, as the graph of FIG. 7 indicates. The remaining energy (or power) which amounts to 80% for a 0.2 $\mu$m photon, essentially appears as kinetic energy which ultimately must be removed as sensible heat. This fractional use of photon energy means that a large fraction of the power contained in the solar spectrum above the threshold is not available for conversion to electricity, as the graph of FIG. 8 shows. All the power below the threshold is also lost, of course. Thus, only the white area under the curve is available for conversion even before solid state conversion efficiencies are considered. This situation is not satisfactory. Two possibilities occur which offer improvement. First, one can shift the spectral peak to more closely match the response function of the solar cells themselves. The spectrum plotted in FIG. 9 is a 3,000° K. black body; it can be seen that the fractional use above the threshold is greatly improved as compared to the previous solar spectrum (FIG. 8).

The second possibility is to use the power available below the threshold by reflecting the photons of these wave lengths back to the radiating body to help maintain its temperature. In practice, of course, some loss must be expected for this reflection, but the net effect of these two possibilities increases the maximum theoretical efficiency of spectral conversion from 46% in the solar spectrum to about 75% for a 3,000° K. spectrum. This is a significant improvement and in actuality represents a different design aim for the construction of solar cells.

Conventional solar cell usage attempts to maximize spectral absorption and accept whatever conversion can be obtained. In accordance with the present invention, however, one attempts by cell design to minimize absorption at wave lengths where the conversion of efficiency is not high. It is desirable for the cell to be transparent to wave lengths that cannot be used efficiently. This then, is a different cell design aim than for conventional usage and as such represents a large potential for improvement.

The efficiency of a cell for conventional usage is power-out over power-in where the latter is the total spectral power, viz.

$$\text{efficiency} = \frac{\text{electrical output}}{\text{energy input}} = \frac{\text{electricity}}{\text{electric} + \text{heat} + \text{reflected} + \text{transmitted}}$$

For the concept of the present invention, efficiency is still defined as power-out over power-in, but the net power-in is only that fraction of the total spectrum that is actually absorbed. This is, of course, less than the total spectral power and the efficiency is thus larger than for conventional usuage with the same output power.

$$\text{efficiency} = \frac{\text{electrical output}}{\text{energy input}} = \frac{\text{electric}}{\text{electric} + \text{heat}}$$

Figure 10:
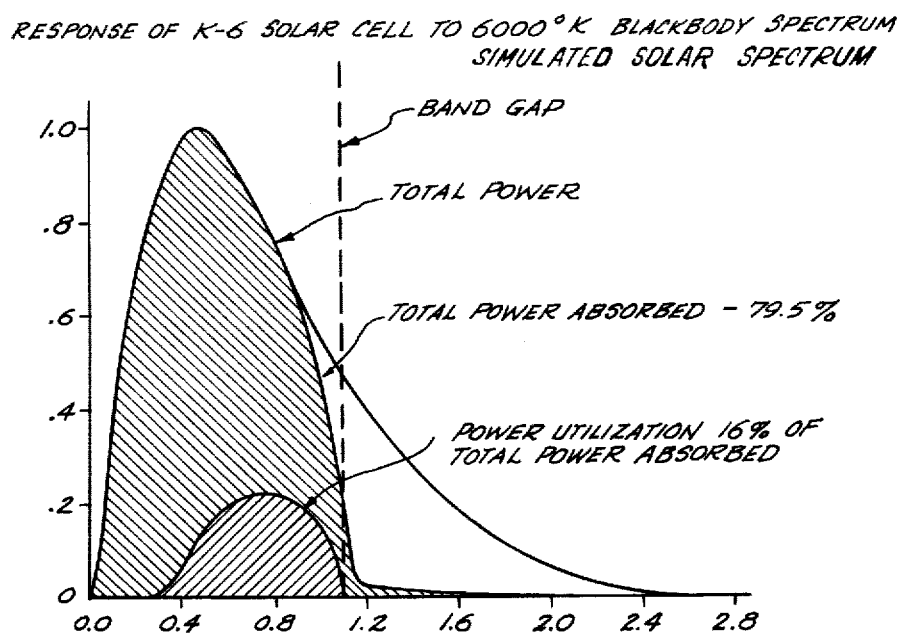
FIG. 10 is a graph showing the response to a N/P−P+Solar Cell to a 6,000° K. Black Body Spectrum, presented as a simulated Solar Spectrum.
Figure 11:
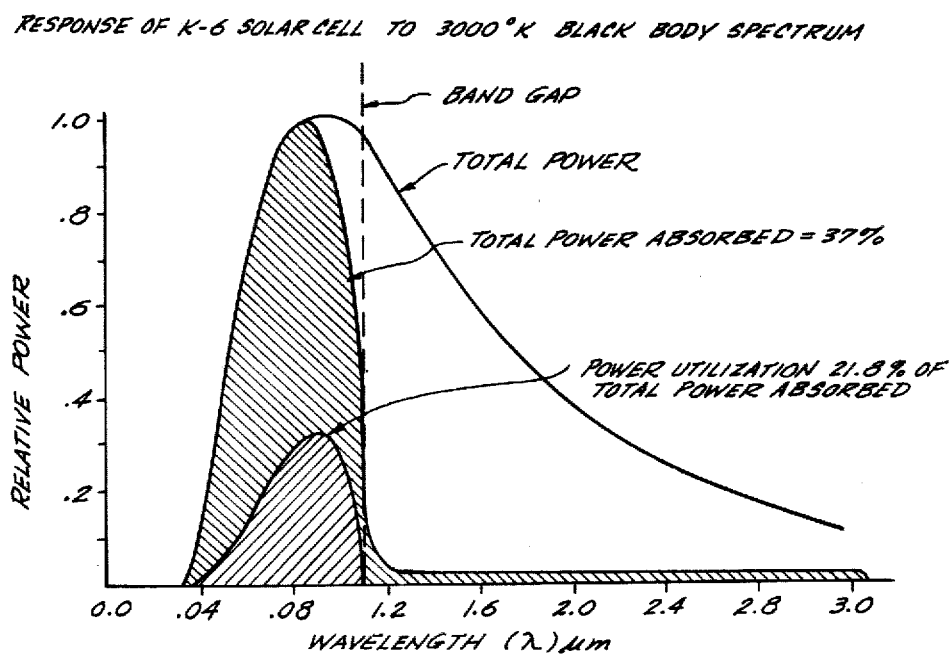
FIG. 11 is a graph like FIG. 10, but showing the response of a N/P−P+Solar Cell to a 3,000° K. Black Body Spectrum.

As an example of the effect of a spectral shift on the power utilization, defined as the fraction of absorbed power converted to electricity, which is the limiting efficiency of this concept, consider a 280 $\mu$m thick N/P−P+ cell exposed to the solar spectrum. The power utilization is 16% and the efficiency to the total spectrum is 13%. This relationship is shown by the graph of FIG. 10. Consider the same cell exposed to a 3,000° K. black body spectrum. The power utilization is increased to 21.8%, a 36% increase over the solar spectrum. This is a sufficient increase in the upper limit of efficiency obtainable and is available without optimizing the cell designed for this use. In fact, this particular cell design is fairly well optimized for conventional usage, which is not a particular advantage for the concept of the present invention.

To see how cell design could be altered to increase power utilization, a calculation was made for the 280 μm thick N/P−P+ cell and compared with measured data available in literature. The agreement is good. The calculation was then performed for thinner cells and the power utilization was found to increase as expected.

It should be emphasized that this alteration in cell design, that is, simply decreasing the thickness, is rather crude. The point to be made is that the potential exists for substantially increasing the power utilization of cells by design alteration.

Figure 14:
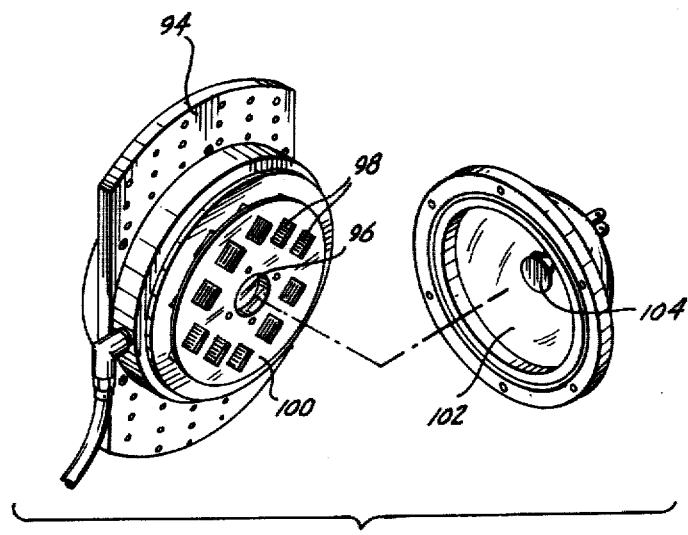
FIG. 14 is an enlarged scale fragmentary view of the housing for the black body and the photovoltaic cells, with a foreground portion thereof cut away for the purpose of better illustrating the construction of the housing and the components therein.

FIGS. 12–14 show a test facility which was successfully used to demonstrate the advantages of the present invention. It comprises a frame 52 mounted for pivotal movement about a horizontal axis 58 between two upright standards 54, 56. The standards 54, 56 are firmly secured at their lower ends to a support base 60.

A large concave reflector 62 (a search light reflector) is mounted onto the frame 52. This was done by cutting a circular opening 64 in a front wall portion 66 of frame 52 and beveling the edge of the opening 54 so that it closely matches the angle of the rear side of the reflector 62. A plurality of retainers, some of which are designated 68, are secured to the front face of wall 66. They each include a portion which overlaps the edge of the reflector 62, so that such edge is trapped between such member 68 and the beveled edge of the opening 64.

A secondary convex reflector 70 is supported generally at the focuss of the primary concave reflector 62. Reflector 70 includes a convex face 72 and an axial shaft 74 which threads into a cylindrical block 76. Cylindrical block 76 is located inside a support ring 78 and is secured thereto by a plurality of radial screws 80. The screws 80 are threaded in and out as necessary for the purpose of positioning the centerline axis of block 76, shaft 74 and the reflector 70 on the centerline axis of the reflector 62. The reflector 70 is rotated like a bolt for the purpose of threading shaft 74 into and out from the block 76 until the mirror surface 72 is properly located relative to the focus of reflector 62. Support ring 78 may be supported by a plurality of support arms 82 which extend between it and securement points on the front wall 66 of frame 52.

A housing for a black body, a third reflector and an array of photovoltaic cells is mounted in the space between the two reflectors 62, 72. This was done so that it would not be necessary to cut an opening at the apex of reflector 62. Housing 84, may include a plurality of mounting arms which extend forwardly from a peripheral portion thereof and extend into sockets 88 which are carried by a pair of members 90 which span across the face of reflector 62. The members 86 are moved endwise through the sockets until the housing 84 is properly positioned and then they are secured in place. The members 90 are movable both endwise and transversely for the purpose of making the axis of housing 84 coincide with the axes of reflectors 62 and 72. Clamps 92 are used for holding the ends of members 90 in proper position.

Referring to FIG. 14, the housing 84 includes a planar forward wall 94 in which a central window 96 has been formed. Ten photovoltaic cells 98 are mounted on the inner surface of wall 94, about the window. The portion of the wall 94 not occupied by the photovoltaic cells 98 is covered by a polished aluminum plate 100 constituting a reflector for that portion of the non-absorbed photon energy which does not fall on the cells. Additional reflector means, for reflecting back the non-absorbed wave length which passes through the cells, is carried by the wall means at a location behind the cells. By way of non-limitative example, the additional reflector means may be a reflective coating applied to the back sides of the cells. A concave reflector 102, constituting the reflector portion of a sealed beam headlight, is secured to the wall 94, with its mirrored surface directed toward the solar cells 98 and the polished aluminum reflector 100. Wall 94 is formed to include a coolant jacket through which a coolant is circulated, for removing heat.

The black body 104 in this test facility is a three-quarter inch diameter, one-sixteenth inch thick carbon disc. It is located generally at the focus of the reflector 102.

In operation, the test installation is faced towards the sun and the frame 52 is tilted until the front wall 66 is substantially perpendicular to the sun's rays. The sun's rays which fall on reflector 62 are concentrated thereby onto the convex reflector 72 which in turn redirects such rays through the window 96 and concentrates them onto the black body 104. The sun's rays heat the black body 104 and it becomes a radiating body. A portion of the radiated energy falls directly on the photovoltaic cells. A second portion is directed towards the near surface of the reflector and is reflected by it to the photovoltaic cells. A portion of the photon energy absorbed by the photovoltaic cells is converted to electrical energy and the remaining absorbed energy heats the cells and the wall 94 and is removed by both radiation and a coolant fluid that is circulated through the coolant jacket. The unabsorbed photon energy is reflected by the mirror surface 102 around the cells and by the mirror surfaces behind the cells back to the black body, either directly or indirectly via a reflection from the mirrored surface.

What is claimed is:

1. A sun powered generator comprising:
photovoltaic cell means;
means for changing the spectral characteristics of sun rays to better match the response function of said photovoltaic cells means, so that more of the photon energy absorbed by the photovoltaic cell means is used to generate electricity and less of such absorbed photon energy merely heats the photovoltaic cell means, comprising:
 a black body which when heated will radiate a black body spectrum of photon energy having a good spectral match with the spectral response of the photovoltaic cell means; and reflector means for collecting sun rays and concentrating them on said black body, to heat and cause it to radiate a black body spectrum of photon energy;
said photovoltaic cell means being spaced from said black body to receive radiated photon energy from said black body and convert it to electrical energy;
wall means defining a chamber and including a window for receiving concentrated sun rays from the reflector means;
wherein the black body is located within said chamber and the photovoltaic cell means are mounted in said chamber;
reflecting means behind said photovoltaic cell means for reflecting that portion of the radiated energy which is emitted from said black body but not absorbed by said photovoltaic means, including that energy transmitted through the cells, back to the black body to help maintain its temperature;

said wall means including a generally parabolic portion having a window at its apex for receiving concentrated sun rays from the reflector means, and a wall portion opposite the apex on which the photovoltaic cell means are mounted, with the generally parabolic portion of the wall means having a mirrored inner surface, and with said black body being located generally at the focus of the mirror surface, so that radiant energy from the black body received by the mirror surface will be reflected by it to the photovoltaic cell means.

2. Apparatus according to claim 1, wherein said wall means includes a coolant jacket outwardly of said photovoltaic cell means, through which coolant fluid is circulated for removing the heat of the apparatus.

3. Apparatus according to claim 1, wherein said black body is a flat disc member extending substantially normal to the rays of sunlight.

* * * * *